[12] United States Patent
Ma et al.

(10) Patent No.: US 8,508,073 B2
(45) Date of Patent: *Aug. 13, 2013

(54) SIMULTANEOUS MULTI-VOLTAGE RAIL VOLTAGE REGULATION MESSAGES

(75) Inventors: Hung-Piao Ma, Portland, OR (US); Alon Naveh, Ramat ha-Sharon (IL); Gil Schwarzband, Yehuda (IL); Annabelle Pratt, Hillsboro, OR (US); Jorge Pedro Rodriguez, Portland, OR (US); Joseph T. Dibene, II, Olympia, WA (US); Sean M. Welch, Bellinghame, MA (US); Kosta Luria, Pardesia (IL); Edward R. Stanford, Dupont, WA (US)

(73) Assignee: Intel Corporation, Santa Clara, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 13/551,481

(22) Filed: Jul. 17, 2012

(65) Prior Publication Data
US 2013/0015715 A1 Jan. 17, 2013

Related U.S. Application Data

(63) Continuation of application No. 13/094,599, filed on Apr. 26, 2011, now Pat. No. 8,222,766, which is a continuation of application No. 11/986,056, filed on Dec. 31, 2007, now Pat. No. 7,932,639.

(51) Int. Cl.
*H02J 1/00* (2006.01)

(52) U.S. Cl.
USPC ............... 307/75; 307/18; 307/72; 323/267

(58) Field of Classification Search
USPC .................. 307/18, 72, 75; 323/267
See application file for complete search history.

(56) References Cited

U.S. PATENT DOCUMENTS

| 6,928,560 | B1 | 8/2005 | Fell, III et al. | |
| 7,017,063 | B2 | 3/2006 | Morse et al. | |
| 7,523,337 | B2 | 4/2009 | Borkar et al. | |
| 7,816,810 | B2 | 10/2010 | Menas et al. | |
| 7,932,639 | B2 * | 4/2011 | Ma et al. | 307/75 |
| 8,222,766 | B2 * | 7/2012 | Ma et al. | 307/75 |
| 2008/0054724 | A1 | 3/2008 | Hosomi et al. | |

OTHER PUBLICATIONS

"Final Office Action for U.S. Appl. No. 11/968,056", (Sep. 21, 2010), Whole Document.
"Non Final Office Action for U.S. Appl. No. 11/968,056", (Apr. 6, 2010), Whole Document.
"Notice of Allowance Action for U.S. Appl. No. 11/968,056", (Dec. 3, 2010), Whole Document.
"Notice of Allowance for U.S. Appl. No. 13/094,599", (Mar. 19, 2012), Whole Document.
"Office Action for U.S. Appl. No. 13/094,599", (Sep. 12, 2011), Whole Document.

* cited by examiner

*Primary Examiner* — Hal Kaplan
(74) *Attorney, Agent, or Firm* — Blakely, Sokoloff, Taylor & Zafman LLP

(57) ABSTRACT

Methods and mechanisms to simultaneously regulate two or more supply voltages provided to an integrated circuit by a voltage regulator. In an embodiment of the invention, a voltage regulation message exchanged between the integrated circuit and the voltage regulator includes an identifier indicating two or more supply voltages selected from a plurality of supply voltages provided to the integrated circuit by the voltage regulator, where the voltage regulation message relates to the indicated two or more supply voltages. In another embodiment, the voltage regulation message indicates a desired supply voltage level to which the indicated two or more supply voltages are to transition.

20 Claims, 3 Drawing Sheets

SIMULTANEOUS MULTI-VOLTAGE RAIL VOLTAGE REGULATION MESSAGES

RELATED APPLICATIONS

The present application is a continuation of U.S. patent application Ser. No. 13/094,599 filed Apr. 26, 2011, entitled "SIMULTANEOUS MULTI-VOLTAGE RAIL VOLTAGE REGULATION MESSAGES", which is to issue on Jul. 17, 2012 as U.S. Pat. No. 8,222,766, which is itself a continuation of U.S. patent application Ser. No. 11/968,056 filed Dec. 31, 2007, which issued on Apr. 26, 2011 as U.S. Pat. No. 7,932,639 with the same title, the priority of which is hereby claimed.

BACKGROUND OF THE INVENTION

1. Field of the Invention

The invention relates generally to providing a plurality of regulated supply voltages to an integrated circuit. In one embodiment, a voltage regulation message is exchanged between an integrated circuit and a VR providing a plurality of supply voltages to the integrated circuit. More particularly, the voltage regulation message may include an identifier indicating two or more supply voltages selected from the plurality of supply voltages provided from the VR to the integrated circuit.

2. Background Art

As semiconductor manufacturing technologies improve, integrated circuits (ICs) are being produced which are more complex, more compact, and which run at higher clock frequencies. Power management of these ICs has also become more complex, as improvements to scale and/or speed of an IC often rely on incremental improvements to power efficiency. One measure of good power management in a system having such an IC is its responsiveness in changing operating characteristic of the system.

In existing systems, a voltage regulator (VR) may be used to provide a supply voltage to an IC such as a processor capable of performing various data processing operations. During operation of the processor, an operating characteristic of the processor may need to be changed—e.g. to accommodate an existing or expected processing load of the processor by having the VR transition from providing the supply voltage at a first supply voltage level to providing the supply voltage at a second supply voltage level. This transition of the supply voltage may be in response to the VR receiving from the IC a message requesting a particular transition for the particular supply voltage.

In some cases, the VR provides multiple supply voltages to the processor. Traditionally, a processor receiving multiple supply voltages from a VR requests transitions of supply voltages individually. For example, a processor may need to change a power state by transitioning both a first supply voltage provided by the VR and a second supply voltage provided by the VR. To implement this change of power state, the processor will initially send to the VR a first message to initiate a transition of the first supply voltage, and then send to the VR a second message to initiate another transition of the second supply voltage.

The delay in changing a power state of an IC which results from sending multiple supply voltage transition requests is an increasingly significant bottleneck to improving IC performance, particularly as the demand for more responsive IC power management mechanisms grows. The impact of these delays may be compounded, for example, by any inherent delays between the sending of the multiple supply voltage transition requests, by any inherent delays in the VR responding to each individual received supply voltage transition request, and/or by any concurrent or future supply voltage transition requests of other ICs. These delays both limit the power management of existing ICs and limit further improvement to IC design which rely on more responsive power management mechanisms.

BRIEF DESCRIPTION OF THE DRAWINGS

The various embodiments of the present invention are illustrated by way of example, and not by way of limitation, in the figures of the accompanying drawings and in which.

DETAILED DESCRIPTION

Embodiments of the invention exchange a voltage regulation message between an IC and a VR providing a plurality of supply voltages to the IC. The voltage regulation message may include information related to the regulation of two or more supply voltages selected from the plurality of supply voltages, wherein the voltage regulation message includes an identifier indicating the selected two or more supply voltages. Based on the voltage regulation message, an operating characteristic can be changed, for example, by concurrently transitioning some of the selected supply voltages each to a desired supply voltage level.

Figure 1:
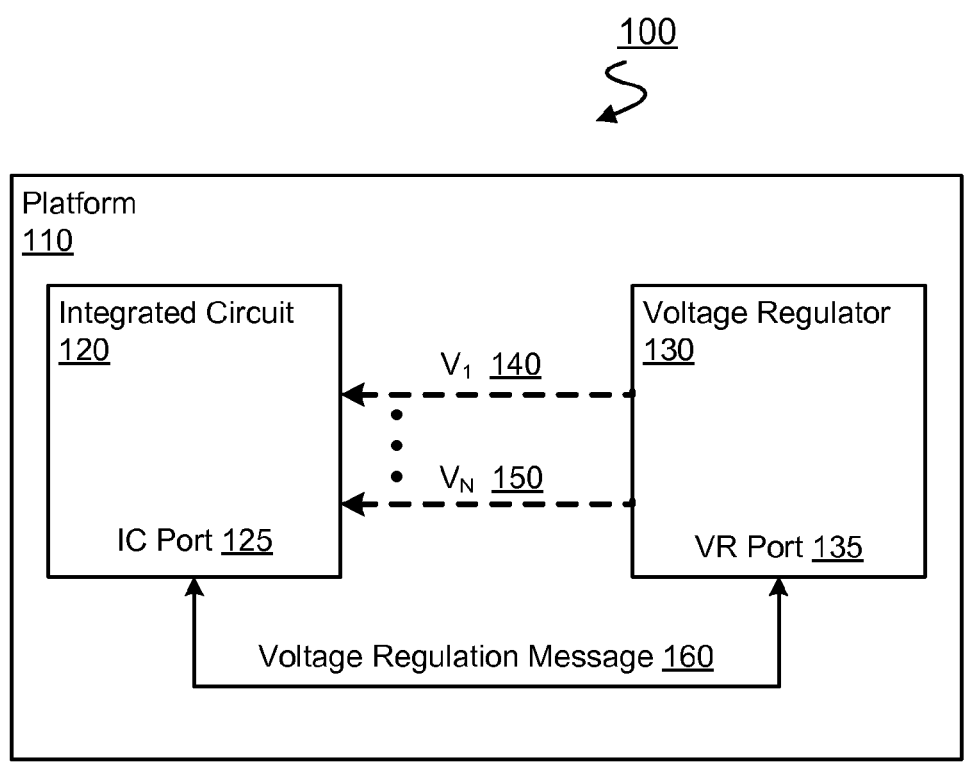
FIG. 1 illustrates, for one embodiment, a block diagram of a platform providing regulated supply voltages.

FIG. 1 is a block diagram 100 illustrating a platform 110 capable of providing a regulated power supply according to an embodiment of the invention. Platform 110 may be any of a variety of computer systems, including but not limited to, a personal computer, laptop, notebook, server, cellular device, wireless handset, personal digital assistant, etc. Platform 110 may include VR 130 providing two or more supply voltages — e.g. supply voltage $V_1$ 140 and supply voltage $V_N$ 150—to an IC 120. In an embodiment, IC 120 may include one or more component circuits sharing a common semiconductor substrate. For example, IC 120 may include a processing unit having one or more processing cores, each processing core capable of performing data processing operations.

VR 130 may include hardware, software or a combination thereof (e.g. firmware) to provide a regulated power supply, which may include providing to IC 120 multiple supply voltages required for operation of one or more component circuits of IC 120. The multiple supply voltages may be controlled by one or more VR controllers (not shown) of VR 130. A given supply voltage provided to IC 120 by VR 130 may be identified by or otherwise associated with a VR controller of VR 130 which controls the given supply voltage, for example, or an output of the VR 130 outputting the supply voltage. Such an output of the VR 130 may also be referred to herein as a "rail". In one embodiment, VR 130 may be a distinct device which is separate from IC 120. Alternatively, VR 130 and IC 120 may be distinct component circuits which share a common semiconductor substrate.

In the course of operation of IC 120, an operating characteristic of IC 120 may need to be changed. In an embodiment, a power state of the IC 120 may need to be changed based on an existing or expected operational load of IC 120—e.g. by transitioning the VR from providing a supply voltage according to one mode of operation to providing the supply voltage according to another mode of operation. A transitioning of a mode of providing a supply voltage may be referred to herein as "transitioning the supply voltage." Transitioning a supply voltage may include transitioning a VR from providing the supply voltage at an initial supply voltage level to providing the supply voltage at a different supply voltage level. Alternatively or in addition, transitioning a supply voltage may include transitioning a VR from providing the supply voltage using an initial total number of phases to providing the supply voltage using a different total number of phases.

In support of transitioning a supply voltage, IC 120 and VR 130 may exchange a voltage regulation message 160—e.g. via an IC port 125 and a VR port 135, respectively. As used herein, "voltage regulation message" refers to any communication which conveys information related to regulation of a supply voltage. Voltage regulation message 160 may be exchanged in a serial communication—e.g. one compatible with a serial communication standard such as the Intel® System Management Bus (SMBUS) (1995), the Philips® I²C Version 2.0 (1998), the Motorola® Serial Peripheral Interface (SPI), the Intel® and Analog Devices® Simple Serial Transport™ (SST™)(2006) or the Intel® Platform Environment Control Interface (PECI)(2006) serial bus standards. Alternatively, voltage regulation message 160 may be exchanged in any of a variety of parallel communication formats well known in the art.

Voltage regulation message 160 may, for example, request a particular regulation of a voltage supply, describe an existing regulation of a voltage supply, or indicate that a particular condition exists which allows for a particular regulation of a voltage supply. In one embodiment, a voltage regulation message 160 may be exchanged from IC 120 to VR 130 to request that VR 130 transition one or more supply voltages. Additionally or alternatively, a voltage regulation message 160 may be exchanged from IC 120 to VR 130 to indicate to VR 130 an existing power state of IC 120. Additionally or alternatively, a voltage regulation message 160 may be exchanged from VR 130 to IC 120 to indicate to IC 120 that a transition of a supply voltage has completed. As discussed herein, the exchange of a single voltage regulation message 160 between IC 120 and VR 130 may support both the transitioning of one supply voltage such as $V_1$ 140 and the transitioning of at least one other supply voltage such as $V_N$ 150.

Based on the exchanged voltage regulation message 160, an operating characteristic of platform 110 may be changed. For example, based on a received voltage regulation message 160, VR 130 may transition a supply voltage from one supply voltage level to another supply voltage level. Alternatively or in addition, VR 130 may transition a supply voltage from using an initial total number of phases to using a different total number of phases. In another embodiment, based on a received voltage regulation message 160 indicating that a transition of two or more supply voltages has increased, IC 120 may change to a different mode of operation—e.g. by changing a frequency of a clock signal to accommodate the new mode of operation.

Figure 2:
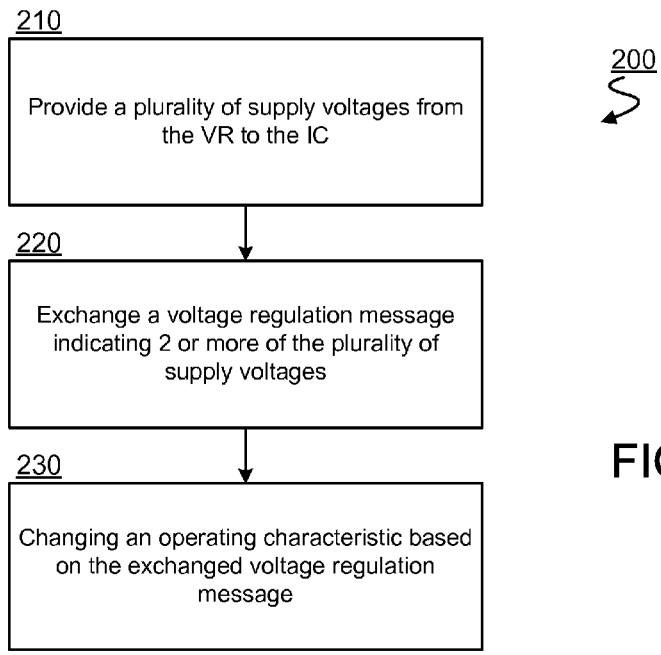
FIG. 2 illustrates, for one embodiment, a state diagram for a method of providing regulated supply voltages.

FIG. 2 illustrates a state diagram for an algorithm 200 for implementing an embodiment of the invention. Algorithm 200 includes, at 210, providing a plurality of supply voltages from a VR in a system to an IC in the system. The IC and VR may correspond, for example, to IC 120 and VR 130, respectively. The IC and VR may be communicatively coupled to one another to allow an exchange of one or more messages between the IC and the VR, for example in a bidirectional manner.

In one embodiment, each of the plurality of supply voltages provided at 210 may be identifiable by a corresponding identifier. For example, the corresponding identifier may identify the supply voltage directly—e.g. by specifying which voltage requirement of the IC is being provided for by the supply voltage. Alternatively or in addition, the corresponding identifier may specify a rail of the VR which is providing the supply voltage to the IC, which may in turn be used to identify the supply voltage. The corresponding identifier may be capable of being used to identify only one supply voltage, or multiple supply voltage. For example, the identifier which corresponds to multiple supply voltages may itself be a composite including one or more component identifiers each capable of being used to identify only one respective supply voltage.

Algorithm 200 may further include, at 220, exchanging between the VR and the IC a voltage regulation message including an identifier indicating two or more supply voltages selected from the plurality of supply voltages. The exchanged voltage regulation message may, for example, be one similar to voltage regulation message 160. The exchanged voltage regulation message may convey information related to regulation of the two or more supply voltages indicated by the identifier in the voltage regulation message. For example, the exchanged voltage regulation message may request a particular regulation of the two or more indicated supply voltages, describe a particular regulation of the two or more indicated supply voltages, or indicate the existence of a particular condition which allows for a particular regulation of the two or more indicated supply voltages. In one embodiment, the exchanged voltage regulation message may include an indication of a voltage level to which the two or more indicated supply voltages are to transition.

Algorithm 200 may further include, at 230, changing an operating characteristic based on the exchanged voltage regulation message. In an embodiment, the changing an operating characteristic may include changing an operating characteristic of one or more of the IC and the VR. For example, where the VR receives the exchanged voltage regulation message, the VR may change an operating characteristic by selectively transitioning the two or more supply voltages indicated in the voltage regulation message—e.g. by transitioning each of the indicated supply voltages to a desired supply voltage level indicated by the voltage regulation message. The VR may transition two or more supply voltages concurrently—e.g. by initiating the respective transitions of the two or more supply voltages at the same time. Similarly, the VR may change an operating characteristic by changing a total number of phases dedicated to the providing of a given supply voltage. For example, the VR may selectively increase or decrease the number of phases which provide current to a VR output for the given supply voltage. Alternatively or in addition, changing an operating characteristic may include the VR selectively changing to a discontinuous inductor current or diode emulation mode to improve efficiency, and/or the VR practicing pulse skipping to adapt to IC operating requirements. The efficiency with which the VR supports the expected power load of the IC may thereby be improved.

In another embodiment, the exchanged voltage regulation message may communicate to the IC that the VR has completed a transition of a given supply voltage. For example, the VR may send to the IC a voltage regulation message which includes an identifier indicating two or more supply voltages and which further indicates that any transition to a new supply voltage level of either or both of the two or more supply voltages has been completed. Based on the exchanged voltage regulation message, the IC may change an operating characteristic, for example, by requesting an increased clock frequency of a clock signal in order to increase a processing speed of the IC.

Figure 3:
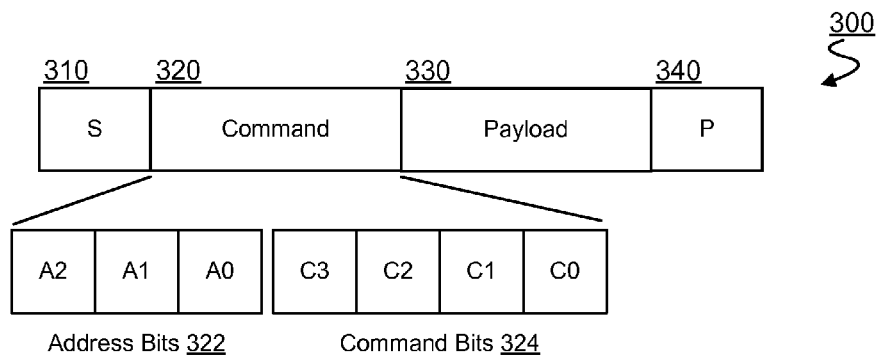
FIG. 3 illustrates, for one embodiment, a block diagram of a voltage regulation message.

FIG. 3 illustrates a voltage regulation message 300 to be exchanged between an IC and a VR according to an embodiment of the invention. The voltage regulation message 300 may be exchanged between an IC such as IC 120 and a VR such as VR 130, for example. In an embodiment of the invention, voltage regulation message 300 may be exchanged in a serial communication between an IC and a VR. Alternatively or in addition, voltage regulation message 300 may be exchanged in the course of implementing a method such as one illustrated by algorithm 200.

Voltage regulation message 300 may include a start field 310 to indicate the beginning of voltage regulation message 300 to a target receiving the voltage regulation message 300. Voltage regulation message 300 may further include a parity field 340 to support parity check as a security feature in the communication of voltage regulation message 300. In an embodiment of the invention, voltage regulation message 300 may include a command field 320 containing address bits 322 and command bits 324. Address bits 322 may indicate the supply voltages to which the voltage regulation message 300 relates. In one embodiment, voltage regulation message 300 may include an identifier of two or more VR rails which provide to the IC two or more corresponding supply voltages selected from the plurality of supply voltages. For example, address bits 322 may represent a bitmap, wherein each bit in address bits 322 corresponds to a particular supply voltage, and wherein the voltage regulation message 300 relates only to those supply voltages whose corresponding bit in address bit 322 is set to a particular value (e.g. those bits set to a logical state of '1'). Alternatively, a unique address indicated in address bits 322 may correspond to a particular combination of two or more supply voltages. For example, the unique address may correspond to a particular combination of two or more supply voltages which is only a subset of the plurality of supply voltages provided from the VR to the IC. In yet another alternative embodiment, address bits 322 may indicate generically that voltage regulation message 300 relates to some multiple voltage rails, while the particular multiple voltage rails to which voltage regulation message 300 relates are indicated by an identifier in the payload 330.

Command bits 324 may indicate a particular instruction to be associated with those supply voltages indicated by address bits 322. For example, command bits 324 may include information indicating that each of the supply voltages indicated by address bits 322 are to transition to a particular supply voltage level. In an embodiment of the invention, command bits 324 may indicate that the supply voltages indicated by address bits 322 are stable, and that any transitioning of these indicated supply voltages to respective supply voltage levels have completed. In yet another embodiment of the invention, command bits 324 may include information indicating that voltage regulation message 300 is describing a particular power state of the IC which may allow for a particular transitioning of the two or more supply voltages indicated by the address bits 322.

Voltage regulation message 300 may include a payload field 330 to provide information related to the command 324 but which may not be included in command bits 324. For example, where command bits 324 indicate that the supply voltages indicated by address bits 322 are to transition to a desired supply voltage level, payload 330 may include an indication of that desired supply voltage level. Where, for example, command bits 324 indicate that voltage regulation message 300 is describing a particular power state of the IC which is associated with the supply voltages indicated by address bits 322, payload 330 may include an indication of the power state in question. Where, in another embodiment, command bits 324 indicate that the supply voltages indicated by address bits 322 are stable, and that any transitioning of the indicated supply voltages has completed, payload 330 may include a description of any transitions which have completed.

Figure 4:
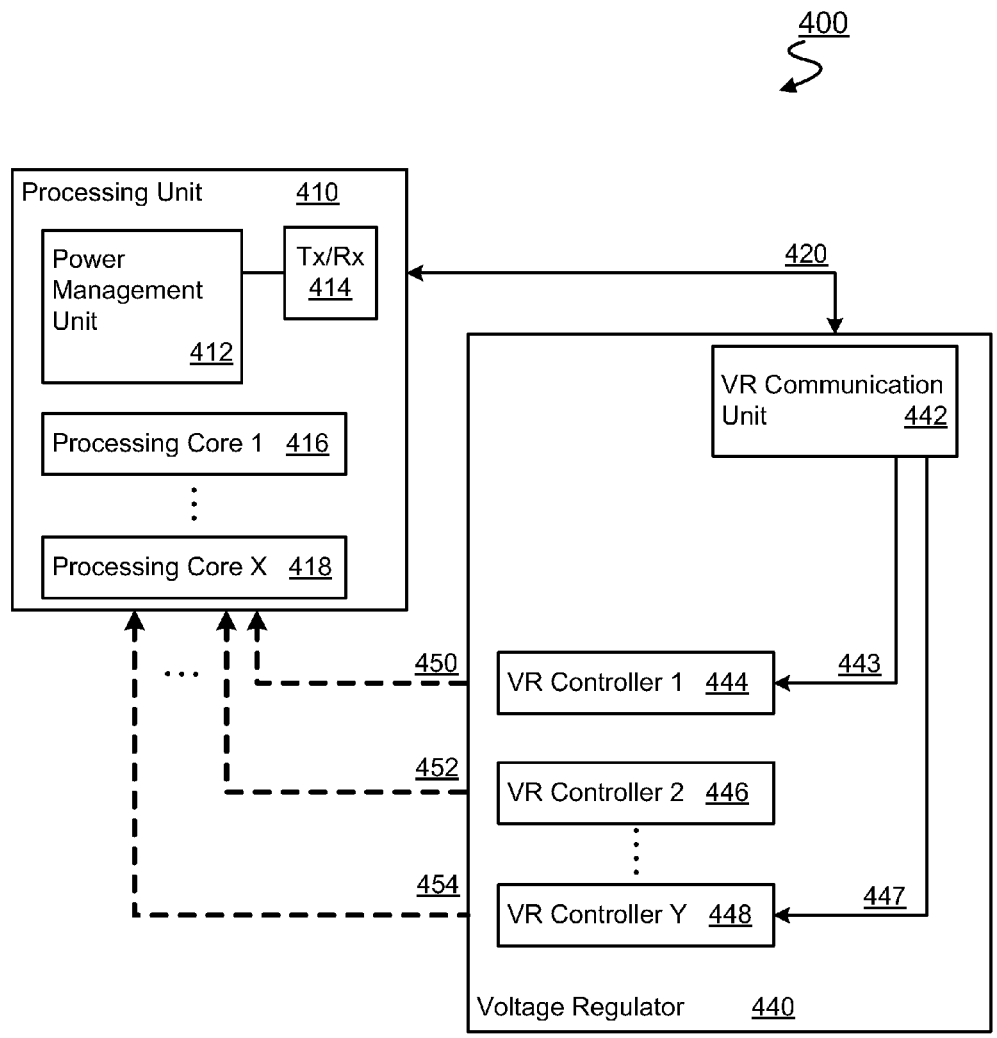
FIG. 4 illustrates, for one embodiment, a block diagram of a platform providing regulated supply voltages.

FIG. 4 illustrates a system 400 to provide a regulated power supply according to an embodiment of the invention. System 400 may include an integrated circuit such as a processing unit 410 to receive one or more supply voltages from a VR 440. Processing unit 410 may include a processing core such as processing core 1 416 to perform any of a variety of data processing operations. Processing core 1 416 may be used in determining a data processing result to be provided as an output from system 400. Additionally, processing unit 410 may further include one or more additional processing cores, represented in FIG. 4 by processing core X 418. The operation of processing core 1 416 and any additional processing core X 418 may depend on any of a variety of combinations of regulated supply voltages provided from a VR 440. For purposes of illustrating features of an embodiment of the invention, FIG. 4 shows supply voltages 450, 452 and 454 being provided from VR 440 to processing unit 410.

Processing core 1 416 may include a power management unit 412 having any of a variety of integrated circuitry components operating to manage power use in processing unit 410. Power management unit 412 may variously include, for example, one or more circuits to determine a power load of processing unit 410, circuitry to determine an expected future power load of processing unit 410, circuitry to determine a desired change to a power state of processing unit 410, and circuitry to determine that a particular change to a power state of processing unit 410 has been initiated and/or completed.

Power management unit 412 may be coupled to a transmit and/or receive unit 414 to exchange a message 420 with VR 440. The exchange of message 420 may be according to a method such as one represented by algorithm 200. Message 420 may include a voltage regulation message such as voltage regulation message 300, for example. In an embodiment, the voltage regulation message in message 420 may include an identifier indicating two or more supply voltages selected from the plurality of supply voltages provided from VR 440 to processing unit 410, where each of the plurality of supply voltages may be identifiable by a corresponding identifier.

VR 440 may include a VR communication unit 442 to exchange with processing unit 410 a message 420 such as a voltage regulation message. Communication unit 442 may be able to generate instructions to selectively transition supply voltages 450, 452 and 454 based on message 420. By way of illustration, VR 440 may control supply voltages 450, 452 and 454, respectively, via VR controller 1 444, VR controller 2 446 and VR controller Y 448. Based on a voltage regulation message received from processing unit 410, VR communication unit 442 may generate instructions 443 and 447 to initiate respective transitions of supply voltage 450 and supply voltage 454 by VR controller 1 444 and VR controller Y 448. Each generated instruction may be specific to a particular VR controller, i.e. the individual instructions may differ from one another. In an embodiment of the invention, the generation of instructions 443 and 447 may be based on information describing one or more VR controllers of VR 440, including, but not limited to a current state of operation of one or more VR controllers of VR 440.

Techniques and architectures for processing data are described herein. In the above description, for purposes of explanation, numerous specific details are set forth in order to provide a thorough understanding of the invention. It will be apparent, however, to one skilled in the art that the invention can be practiced without these specific details. In other instances, structures and devices are shown in block diagram form in order to avoid obscuring the description. Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Some portions of the detailed descriptions which follow are presented in terms of algorithms and symbolic representations of operations on data bits within a computer memory. These algorithmic descriptions and representations are the means used by those skilled in the computing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The present invention also relates to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs) such as dynamic RAM (DRAM), EPROMs, EEPROMs, magnetic or optical cards, or any type of media suitable for storing electronic instructions, and each coupled to a computer system bus.

The algorithms and displays presented herein are not inherently related to any particular computer or other apparatus. The required structure for a variety of these systems will appear from the description. In addition, the present invention is not described with reference to any particular programming language. It will be appreciated that a variety of programming languages may be used to implement the teachings of the invention as described herein. Besides what is described herein, various modifications may be made to the disclosed embodiments and implementations of the invention without departing from their scope. Therefore, the illustrations and examples herein should be construed in an illustrative, and not a restrictive sense. The scope of the invention should be measured solely by reference to the claims that follow.

What is claimed is:

1. An apparatus including:
   a voltage regulator (VR) to couple to an integrated circuit (IC), the VR to provide a plurality of supply voltages to the IC, including the VR to provide:
      a first supply voltage at a first supply voltage level; and
      a second supply voltage at a second supply voltage level;
   the VR further to exchange with the IC a voltage regulation message which identifies two or more supply voltages of the plurality of supply voltages, wherein the voltage regulation message further indicates a desired regulation of each of the two or more supply voltages, the VR further to concurrently transition the first supply voltage away from the first voltage level and transition the second supply voltage away from the second voltage level, wherein the VR to concurrently transition the first supply voltage and the second supply voltage based on the exchanged voltage regulation message.

2. The apparatus of claim 1, wherein the voltage regulation message indicates a desired voltage level, and wherein the VR to concurrently transition the first supply voltage and the second supply voltage includes the VR to concurrently transition the first supply voltage toward the desired voltage supply level and transition the second supply voltage toward the desired voltage supply level.

3. The apparatus of claim 1, wherein the voltage regulation message identifies a subset of the plurality of voltages.

4. The apparatus of claim 1, wherein the VR to provide the plurality of supply voltages includes the VR to provide one of the two or more supply voltages with an output of the VR, and wherein the voltage regulation message identifies the one of the two or more supply voltages with an identifier of the output of the VR.

5. The apparatus of claim 1, wherein the IC includes a processing unit having one or more processing cores, and wherein the VR to provide the plurality of supply voltages includes the VR to provide the plurality of supply voltages to a single processing core.

6. A method at a voltage regulator (VR), the method including:
   providing a plurality of supply voltages to an integrated circuit (IC) coupled to the VR, including:
      providing a first supply voltage at a first supply voltage level; and
      providing a second supply voltage at a second supply voltage level;
   exchanging with the IC a voltage regulation message which identifies two or more supply voltages of the plurality of supply voltages, wherein the voltage regulation message further indicates a desired regulation of each of the two or more supply voltages; and
   based on the exchanged voltage regulation message, concurrently transitioning the first supply voltage away from the first voltage level and transitioning the second supply voltage away from the second voltage level.

7. The method of claim 6, wherein the voltage regulation message indicates a desired voltage level, and wherein the VR concurrently transitions the first supply voltage toward the desired voltage supply level and transitions the second supply voltage toward the desired voltage supply level.

8. The method of claim 6, wherein the voltage regulation message identifies a subset of the plurality of voltages.

9. The method of claim 6, wherein the VR provides one of the two or more supply voltages with an output of the VR, and wherein the voltage regulation message identifies the one of the two or more supply voltages with an identifier of the output of the VR.

10. The method of claim 6, wherein the IC includes a processing unit having one or more processing cores, and wherein the VR provides the plurality of supply voltages to a single processing core.

11. An apparatus including:
an integrated circuit (IC) to couple to a voltage regulator (VR), the IC to receive a plurality of supply voltages from the VR, including the IC to receive:
a first supply voltage at a first supply voltage level; and
a second supply voltage at a second supply voltage level;
the IC further to exchange with the VR a voltage regulation message which identifies two or more supply voltages of the plurality of supply voltages, wherein the voltage regulation message further indicates a desired regulation of each of the two or more supply voltages, wherein, based on the exchanged voltage regulation message, the VR concurrently transitions the first supply voltage away from the first voltage level and transitions the second supply voltage away from the second voltage level.

12. The apparatus of claim 11, wherein the voltage regulation message indicates a desired voltage level, and wherein the VR concurrently transitions the first supply voltage toward the desired voltage supply level and transitions the second supply voltage toward the desired voltage supply level.

13. The apparatus of claim 11, wherein the voltage regulation message identifies a subset of the plurality of voltages.

14. The apparatus of claim 11, wherein the IC to receive the plurality of supply voltages includes the IC to receive one of the two or more supply voltages via an output of the VR, and wherein the voltage regulation message identifies the one of the two or more supply voltages with an identifier of the output of the VR.

15. The apparatus of claim 11, the IC comprising a processing unit having one or more processing cores, wherein the IC to receive the plurality of supply voltages includes a single core of the one or more processing cores to receive the plurality of supply voltages.

16. A method at an integrated circuit (IC), the method including:
receiving a plurality of supply voltages from a voltage regulator (VR) coupled to the IC, including receiving:
a first supply voltage at a first supply voltage level; and
a second supply voltage at a second supply voltage level;
exchanging with the VR a voltage regulation message which identifies two or more supply voltages of the plurality of supply voltages, wherein the voltage regulation message further indicates a desired regulation of each of the two or more supply voltages, wherein, based on the exchanged voltage regulation message, the VR concurrently transitions the first supply voltage away from the first voltage level and transitions the second supply voltage away from the second voltage level.

17. The method of claim 16, wherein the voltage regulation message indicates a desired voltage level, and wherein the VR concurrently transitions the first supply voltage toward the desired voltage supply level and transitions the second supply voltage toward the desired voltage supply level.

18. The method of claim 16, wherein the voltage regulation message identifies a subset of the plurality of voltages.

19. The method of claim 16, wherein receiving the plurality of supply voltages includes receiving one of the two or more supply voltages via an output of the VR, and wherein the voltage regulation message identifies the one of the two or more supply voltages with an identifier of the output of the VR.

20. The method of claim 16, wherein the IC comprises a processing unit having one or more processing cores, wherein receiving the plurality of supply voltages includes receiving the plurality of supply voltages at a single core of the one or more processing cores.

* * * * *